United States Patent [19]

Croft

[11] Patent Number: 5,574,618
[45] Date of Patent: Nov. 12, 1996

[54] ESD PROTECTION USING SCR CLAMPING

[75] Inventor: Gregg D. Croft, Palm Bay, Fla.

[73] Assignee: Harris Corporation, Melbourne, Fla.

[21] Appl. No.: 198,002

[22] Filed: Feb. 17, 1994

[51] Int. Cl.⁶ .................................. H05F 3/00; H02H 3/20
[52] U.S. Cl. .......................... 361/212; 361/220; 361/118
[58] Field of Search ..................................... 361/212, 220, 361/56, 91, 111, 118; 327/438, 439

[56] References Cited

U.S. PATENT DOCUMENTS

4,870,530  9/1989  Hurst et al. ................................. 361/91
5,012,317  4/1991  Rontre ..................................... 361/56 X

*Primary Examiner*—Fritz M. Fleming
*Attorney, Agent, or Firm*—Joel I. Rosenblatt

[57] ABSTRACT

An SCR clamp provides a low impedance discharge path for static charges across on IC's pins. The SCR clamp cathode, cathode, gate anode, and anode gate float when the protected IC is disconnected from its associated circuit elements. Under this condition, the SCR clamp can be turned on at the low Vh and Ih levels of the SCR, allowing the clamp to operate to discharge static electricity at the low voltage determined by SCR junction biases.

20 Claims, 9 Drawing Sheets

ESD PROTECTION USING SCR CLAMPING

FIELD OF THE INVENTION

This invention relates to Electrostatic Discharge (ESD) protection for integrated circuits.

BACKGROUND OF THE INVENTION

Integrated circuits may be provided with ESD protection circuits to protect the integrated circuit (IC) from any electrostatic charge which may be potentially damaging.

The ESD protection is generally applied to the IC's I/O pads or pins. The protection may comprise a high conductance path from the I/O pads to a voltage supply pin. Typically, each and every I/O pin is connected to the positive and negative supply pins by normally reverse bias diodes. However, during an ESD event these diodes may be forward or reversed biased. As is well known, reverse bias diodes provide higher voltage discharge paths for ESD than forward biased diodes. Power dissipated in a reverse bias diode due to an ESD event is a multiple higher than the same diode when forward biased. Therefore, reverse bias diodes used in ESD discharge paths require larger size junction areas than forward biased diodes. Accordingly, it is preferable to avoid using reverse bias diodes in the ESD discharge paths.

In connection with diode ESD paths, a clamping circuit has been used. The clamping circuit is typically connected across the power supply. The clamp provides conduction at a voltage higher than the supply but lower than the breakdown voltage of the back biased I/O protection diodes. The clamp has been used to bypass the back bias I/O protection diodes reducing their size requirement by reducing their power dissipation requirement.

While the addition of a clamp provides a greater level of ESD protection, the clamp voltage must still be set higher than the supply voltage. Therefore, the conduction voltage of all the ESD discharge paths through the supply clamp will be higher than the normal supply voltage.

Accordingly, ESD protection using I/O protection diodes with or without clamping cannot provide low voltage protection, less than a normal supply voltage.

SUMMARY OF THE INVENTION

The invention described in this application provides low level ESD protection through a power supply clamp using SCR's as clamping elements. As shown in the preferred embodiment according to the principles of the invention, the ESD voltage protection level may be clamped at a level less than the supply voltage. In this way, the ESD protection circuit may protect components which may be damaged by ESD discharges less than the voltage supply, such as a differential transistor pair. As would be known by those skilled in the art, a differential transistor pair at the input of an operational amplifier, for example, would be damaged by an ESD pulse applied directly across the bases of the input transistors. Since the breakdown voltages of base emitter junctions are normally low, it is likely that one of the base emitter junctions would break down before the ESD protection circuit would become active and damage would occur.

DESCRIPTION OF PREFERRED EMBODIMENT

Figure 1A:
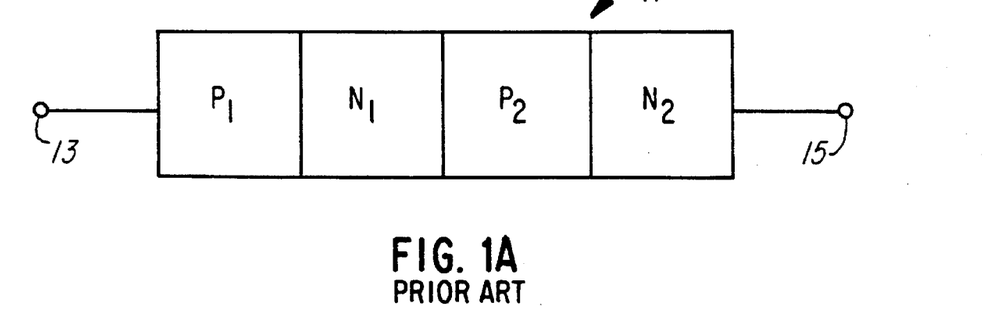
FIG. 1A shows the internal structure of an SCR comprising P and N semiconductor materials.
Figure 1B:
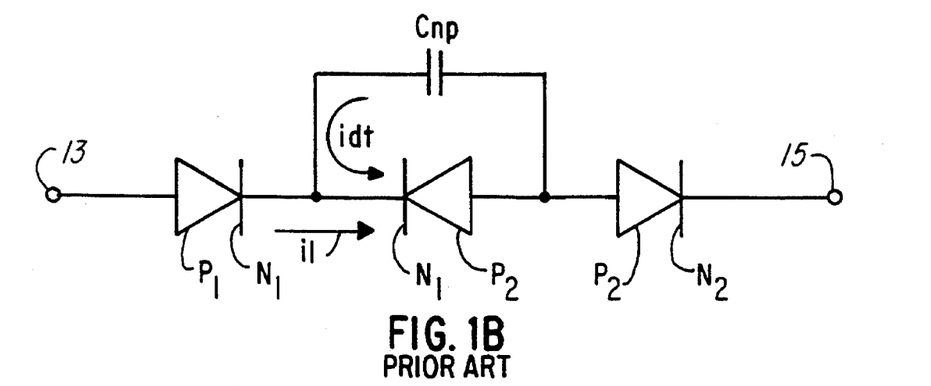
FIG. 1B shows in schematic form, the PN junctions formed by the structure of FIG. 1A.
Figure 1C:
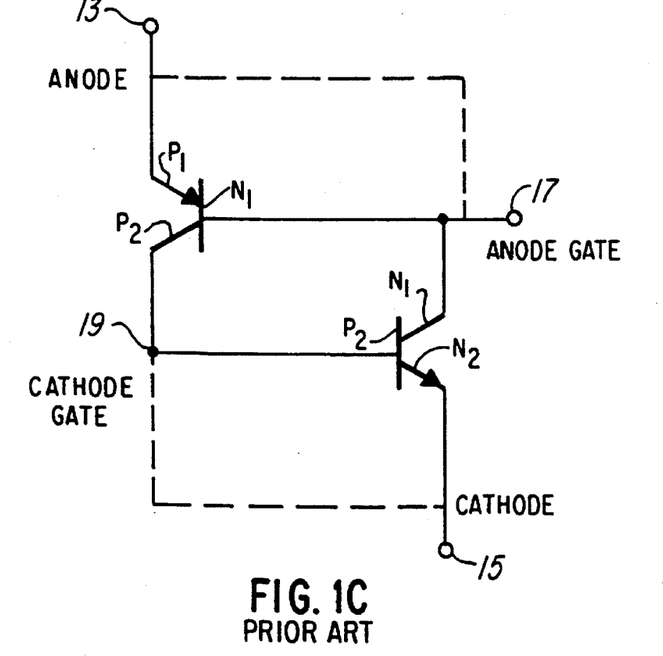
FIG. 1C shows the PNP and NPN transistors formed by the structure shown in FIG. 1A and the identity of the anode, cathode, anode gate, and cathode gate formed by the structure of FIG. 1A.

SCR's, as known to those skilled in the art, are shown in FIG. 1a and generally referred to by numeral 11. The SCR has an anode 13 and a cathode 15. The SCR is a four-layer PNPN structure, as shown in FIG. 1a. For the purpose of explanation, P1 is identified as the anode, N1 as the anode gate, P2 as the cathode gate, and N2 as the cathode. As would be known to those skilled in the art, the junction comprising N1 and P2 has a junction capacitance shown as Cnp and is back biased with regard to the P1 N1 junction and P2 N2 junction, as shown in FIG. 1b. Accordingly, an electrostatic voltage appearing across terminals 13 and 15 would produce a transient current idt as shown through capacitor Cnp and a leakage current il from the anode 13 to cathode 15. An SCR is shown in schematic form in FIG. 1C. To prevent the SCR from conducting, the anode gate 17 would be the shorted to the anode 13 and cathode gate 19 would shown as shorted to the cathode 15, as shown by the dashed lines. This is a common configuration in CMOS circuits to prevent parasitic SCR's from latching.

As further explained in *Physics of Semiconductor Devices*, 2nd Edition, S. M. Sze, John Wiley & Sons, New York, P192, the SCR is a bi-stable device that can switch from a high impedance, low current off state to a low impedance, high current on state or visa versa. In the forward region, of SCR operation, the SCR is in the off condition below a holding voltage Vh and a holding current, Ih. Above this region Vh, Ih the SCR is forward conducting and in its on state. According to the principles of the invention as shown in the preferred embodiment, the clamping level SCR conduct in the region above the holding voltage Vh and the holding current Ih of the SCR.

Figure 2:
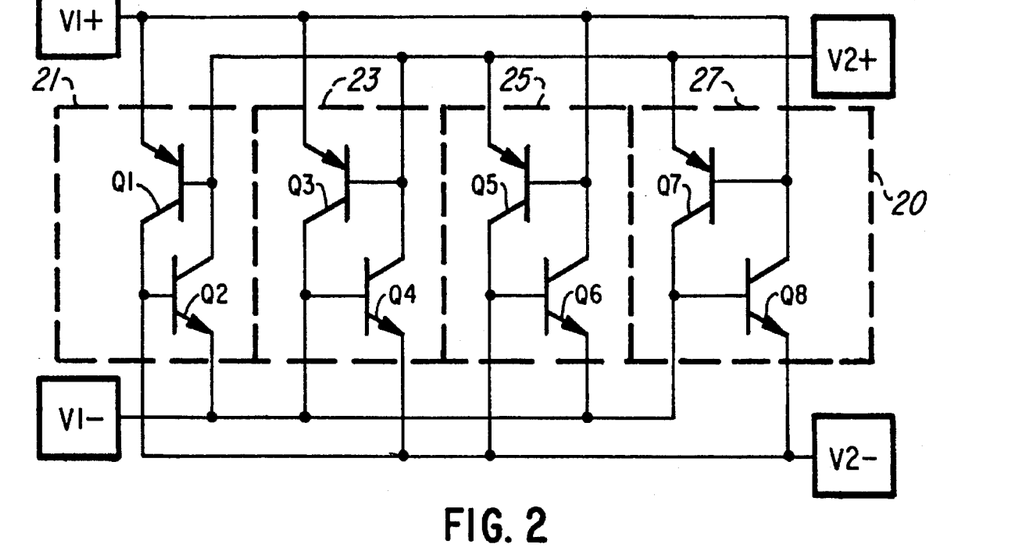
FIG. 2 shows a preferred embodiment for using the SCR clamp.

According to the inventive principles, the preferred embodiment is shown in FIG. 2.

As shown, four SCR's; SCR1, SCR2, SCR3, and SCR4, shown enclosed in dashed lines and designated generally by 20 and by numerals 21, 23, 25, 27 respectively, are connected as shown between floating supply pins V1+, V1− and V2+, V2−. SCR, 21 is shown with its anode connected to V1+ and its cathode connected to V1−. Its anode gate connected to V2+ and its cathode gate connected to V2−.

SCR, 23, is shown with its anode connected to V1+ and its cathode connected to V2−, its anode gate connected to V2+ and its cathode gate connected to V1−.

Similarly, SCR, 25 is connected anode to V2+, anode gate to V1+, cathode to V1−; and cathode gate to V2−.

SCR, 27, is connected anode to V2+, anode gate to V1+, cathode to V2− and cathode gate to V1−.

As can be seen, according to the principles of the invention as shown by the preferred embodiment, the anodes, cathodes, anode gates and cathode gates connect the floating supplies to provide low voltage paths between separate and distinct combinations of floating supply pins V1+, V1−, V2+, V2−.

Figure 3:
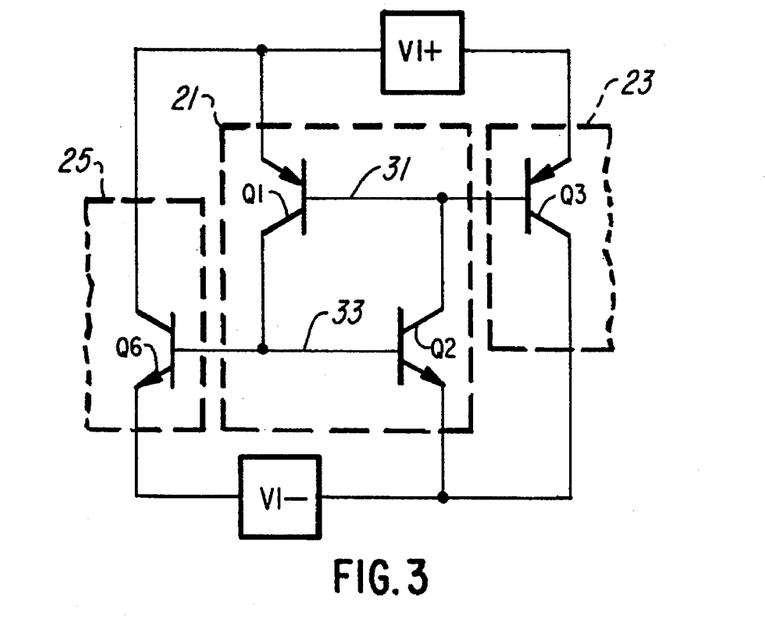
FIG. 3 shows in simplified form the operation of the SCR clamp of FIG. 2.

FIG. 3 shows a simplified schematic of how the quad SCR clamping circuit in FIG. 2 would appear with a static charge appearing between floating pins V1+ and V1−, for example, and with no static charge on floating pins V2+ and V2−. Accordingly, base to collector leakage current il as shown in FIG. 1b., would be present through SCR, 21. The rapidly rising voltage (dv/dt) between the anode gate 31 and the cathode gate 33 will cause a current Cdv/dt, as shown in FIG. 1b, acting as a gate current idt to SCR, 21. The currents il and idt will cause latching of SCR,21. As can be seen from FIG. 2, Q1 of SCR1, 21 has a common base and common emitter connection sharing base current and forming a current mirror with Q3 of SCR, 23. Similarly, Q2 of SCR, 21 and Q6 of SCR, 25 have common base and common emitters sharing base current and forming a second current mirror Q2−Q6. Accordingly, conductive paths are formed through the Q1, Q2 of SCR21 and Q3 of SCR23 and Q6 of SCR25.

Accordingly, as shown where the SCR anode and anode gate are not shorted, and cathode and cathode gates are not shorted, the clamp circuit as shown in FIG. 2 provides a low voltage supply clamp for discharging static charge at a voltage level limited only by the bias voltages produced internally at the PN junctions.

Figure 4:
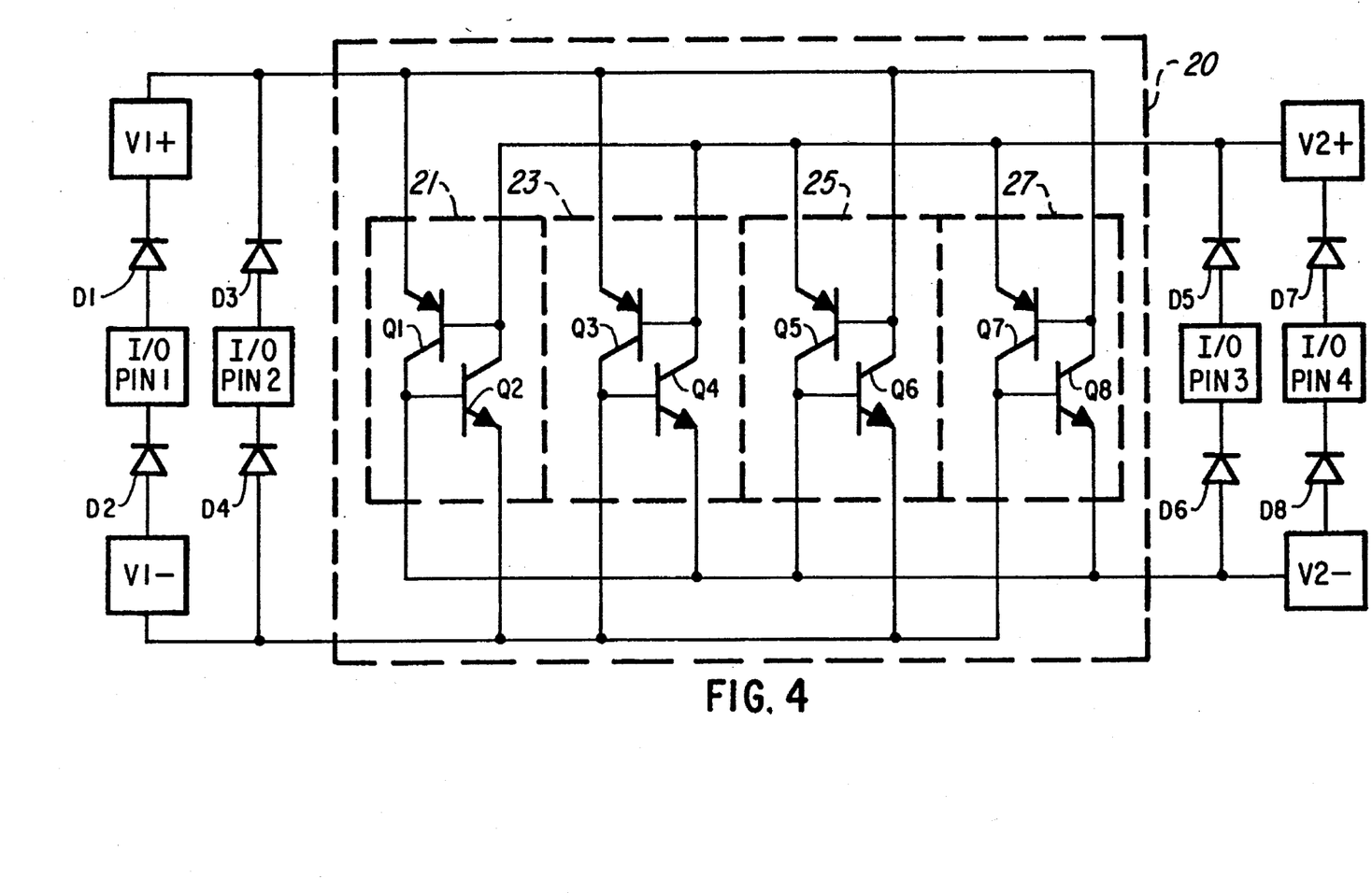
FIG. 4 shows a modified version of the SCR clamp used in combination with I/O pins protected by forward and back biased diodes.
Figure 4A:
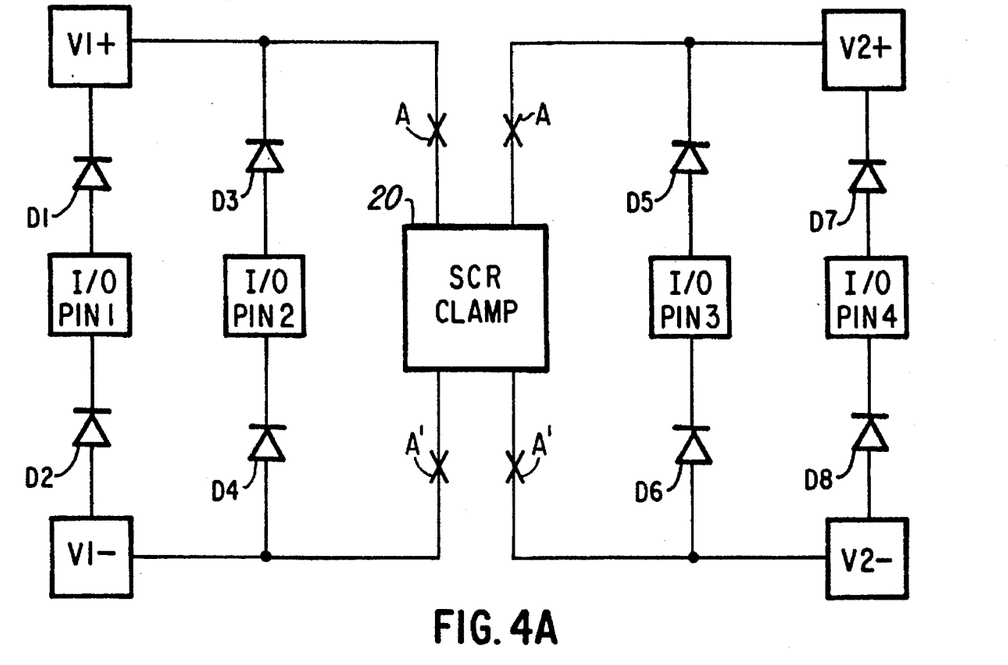
FIG. 4A shows the circuit of FIG. 4 with the SCR clamp removed.

ESD protection, for example, by the SCR clamping circuit of FIG. 2, is now shown in FIG. 4. In FIG. 4, the SCR clamping circuit of FIG. 2 is used as a clamp to discharge any static charge existing on I/Q pins connected to floating supply pins by diodes arranged to be back biased when power is applied to the floating pins with polarity shown. Referring now to FIG. 4A, the SCR clamping circuit is shown within the dashed block outline 20. The individual SCR's are shown within the dashed outlines 21, 23, 25, and 27 of block 20, the same as in connection with FIG. 2. For the purpose of explanation, assume for the moment that the SCR clamping circuit 20 is removed as shown in FIG. 4A by the broken connections A−A¹. As shown in FIG. 4A, each I/O pin is connected to the positive and negative supply pins (V1+, V1−, V2+, V2−) by reverse bias diodes. While the supply pins are floating, or without power, diodes protect the integrated circuits connected to the I/O pins by providing discharge paths diverting potentially harmful current away from the IC's and limiting the discharge voltage across the IC's. In the case of FIG. 4A, forward biased diodes make excellent low impedance discharge paths for any electrostatic charge. However, during an ESD discharge, reverse bias diodes dissipate more power than the forward biased diodes and thus require larger junctions. Accordingly, it is preferable to avoid using reverse bias diodes in ESD discharge paths. For example, for a static charge between I/O pins 1 and 2, and with the SCR clamp 20 removed, the discharge path would be through forward biased diode D1, reversed biased diode D2, reversed bias diode D3 and forward biased diode D4.

Referring to FIG. 4, the SCR clamping circuit 20 operates as shown in regard to FIG. 2 to discharge any positive static charge between any of the I/O pins, or between V1+ or V2+ pins. As explained with regard to FIG. 2, the static charge between I/O pin 1 and pin 2 would cause a leakage current and a rapidly rising current i/dt due to the dv/dt change in voltage causing latching. As shown with regard to FIG. 2, and FIG. 3, and as described above, the SCR clamp, when latched, provides a low impedance path to discharge any positive static charges between I/O pins 1 and 2, through latched SCR 21 and Q6 of SCR 25 and Q3 of SCR 23.

Figure 4B:
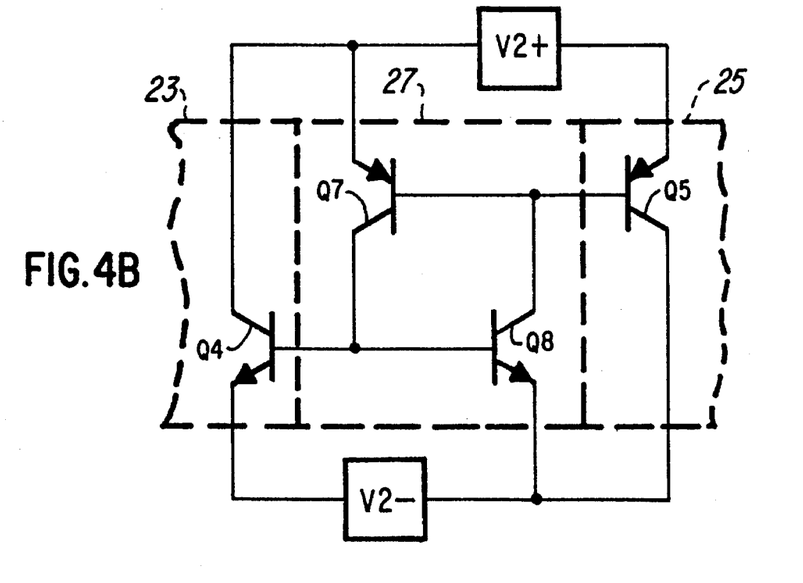
FIG. 4B shows the operation of the SCR clamp of FIG. 4 with a static charge between I/O pins 3 and 4.

Similarly, for any positive static charge between I/O pins 3 and 4, the leakage current il and the idt current will trigger SCR 27 and Q5 of SCR 25 and Q4 of SCR 23. The leakage current il and idt current directions acts as gate current for the SCR formed by Q7 and Q8. Base current for Q7 will be shared with Q5 and base current for Q8 will be shared with Q4. Due to the common base emitter configuration of Q8 and Q4 and of Q7 and Q5, Q4 and Q5 will also conduct and provide additional paths to discharge the static charge. The simplified schematic of the operation of the latched of SCR clamping circuit in the case of a charge between I/O pins 3 or 4 is shown in FIG. 4b.

Any charge appearing on supply terminals V1− and V2− would be discharged through forward biased base emitter diodes of the SCRS. In this way, the discharge paths are through the base emitter junction of Q4 of SCR 23 in parallel with Q8 at SCR 27 or through Q6 of SCR 25 in parallel with Q2 of SCR 21.

Figure 5:
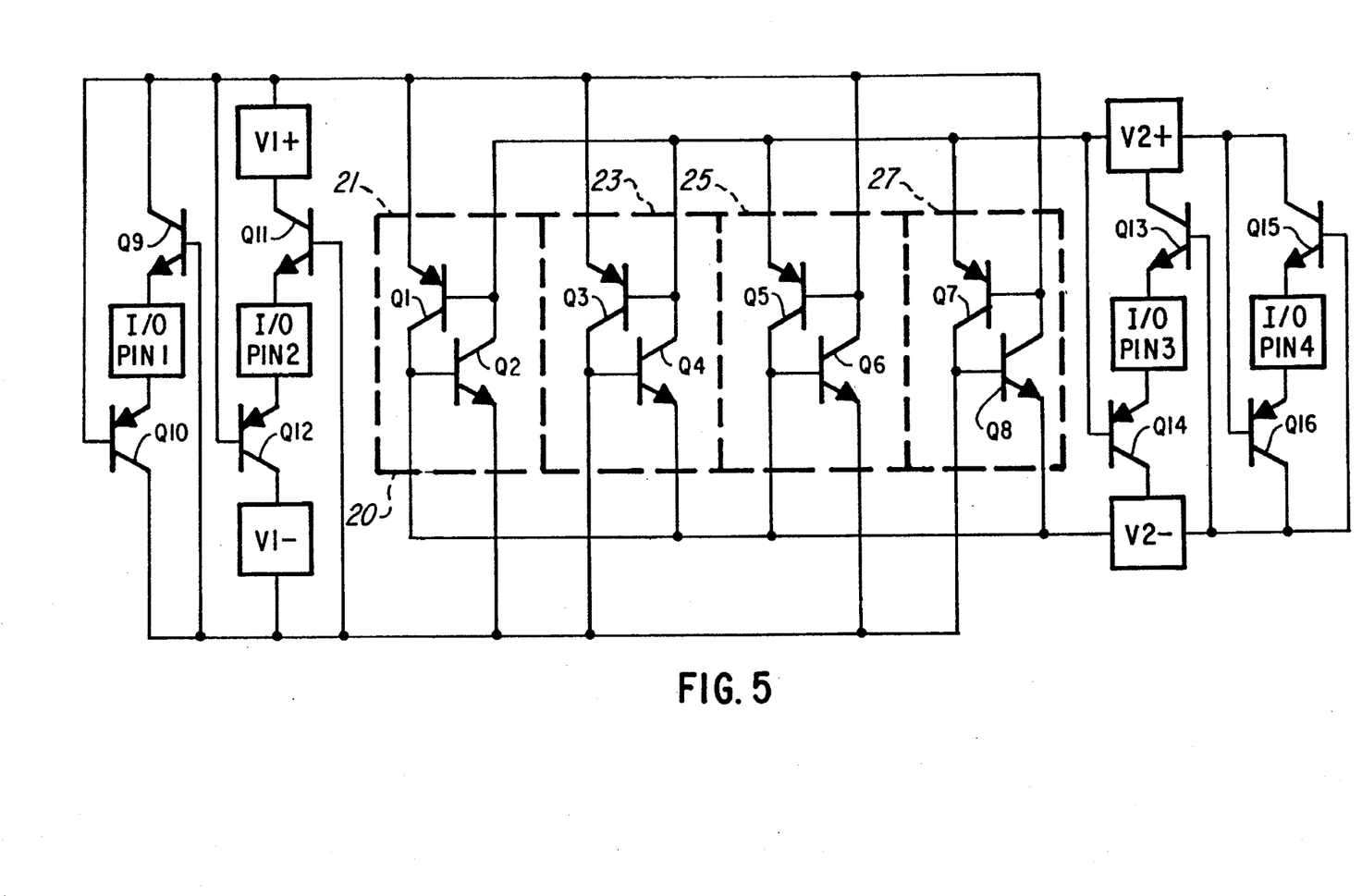
FIG. 5 shows the clamping circuit used in connection with NPN and PNP transistors substituted for the forward and back biased diodes shown in FIG. 4.
Figure 6:
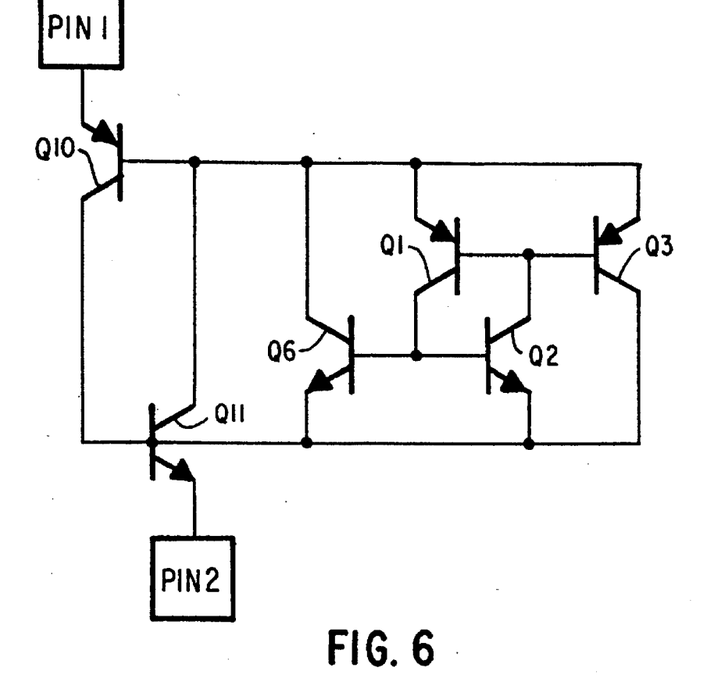
FIG. 6 shows the clamp of FIG. 5 operating with a static charge of I/O pin 1 and I/O pin 2.

FIG. 5 shows a way of using the clamping circuit shown in dashed outline 20 in connection with the base emitter diodes of NPN and PNP transistors, substituted for diodes D1−D8 shown in FIG. 4. In operation, the transistors provide additional discharge paths for any static charge. For example, for purposes of explanation assume a static charge exists between I/O pin 1 and I/O pin 2. The discharge paths would be as shown in FIG. 6. In such case, a discharge path exists through the SCR 21 and Q3 of SCR 23 forming a current mirror with Q1 of SCR 21 and Q6 of SCR 25 forming current mirror with Q2 of SCR 21, as explained previously. This latched clamp circuit above, in combination with the base emitter junction of Q10 establishes a path from I/O pin 1 through the clamp as shown in FIG. 6 and through the base emitter junction of Q11 to I/O pin 2, Additionally, the collectors of Q10 and Q11 form a conductive path due to the emitter base current of Q10 and Q11, completing a path from I/O pin 1 through the emitter base junction of Q10 and the emitter collector terminals of Q11 to I/O pin 2, and an additional path from I/O pin 1 through the emitter collector terminals of Q10 and the base emitter junction of Q11 to I/O pin 2.

As would be apparent to those skilled in the art, a static charge between I/O pin 1 or 2 and V1+ or between I/O pin 3 or 4 and V2+ would be discharged by forward biased base emitter diodes. Another example would be a charge appearing between V1+ and V2+. That discharge path would be from V1+ through the emitter base junction of Q1, in parallel with the base emitter diode of Q3, to V2+. A reverse path from V2+ to V1+ would be through the emitter base diode of Q7, in parallel with the base emitter diode of Q5, to V1+. As would be apparent to those skilled in the art, depending upon the points in the circuit with a static charge potential, a number of paths are provided through the clamp and using the collector base, emitter-base and emitter collector junctions of the respective transistors.

Figure 7:
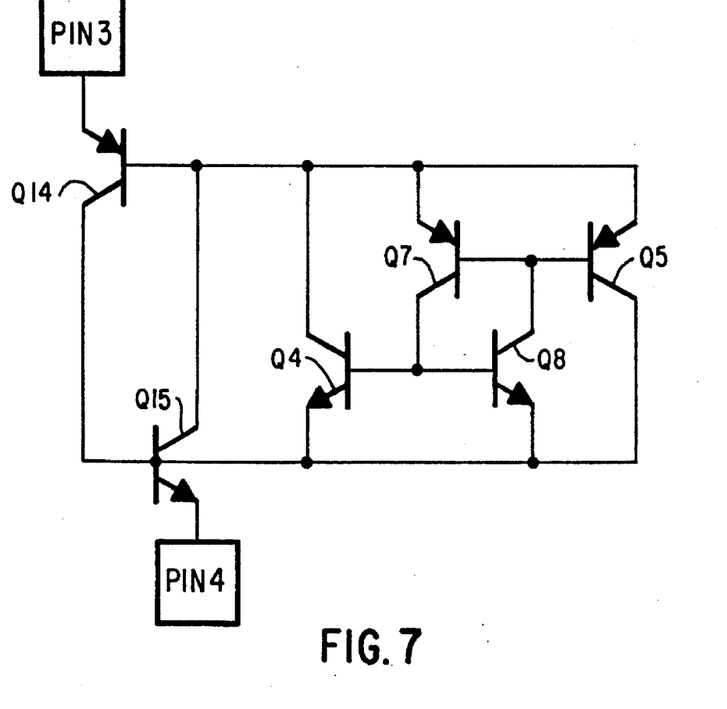
FIG. 7 shows the clamping circuit of FIG. 5 with a static charge operating between I/O pin 3 and I/O pin 4.

A further example would be in the case of a charge existing between pin 3 and pin 4. In that case, similar to a charge existing between pin 1 and pin 2, the path would be from pin 3 through the base emitter junction of Q14 to V2+ through the SCR 27 and Q4 of SCR 23 and Q5 of SCR 25 to V2− and through the base emitter junction of Q15 to pin 4, as shown in FIG. 7. In the case of a reverse charge existing between V1− and V1+, the path would through the base collector junctions of Q10, Q12, Q9, and Q11. The reverse path for charges between V2− and V2+ would be the collector base junctions of Q13, Q14, Q15, and Q16.

Figure 8:
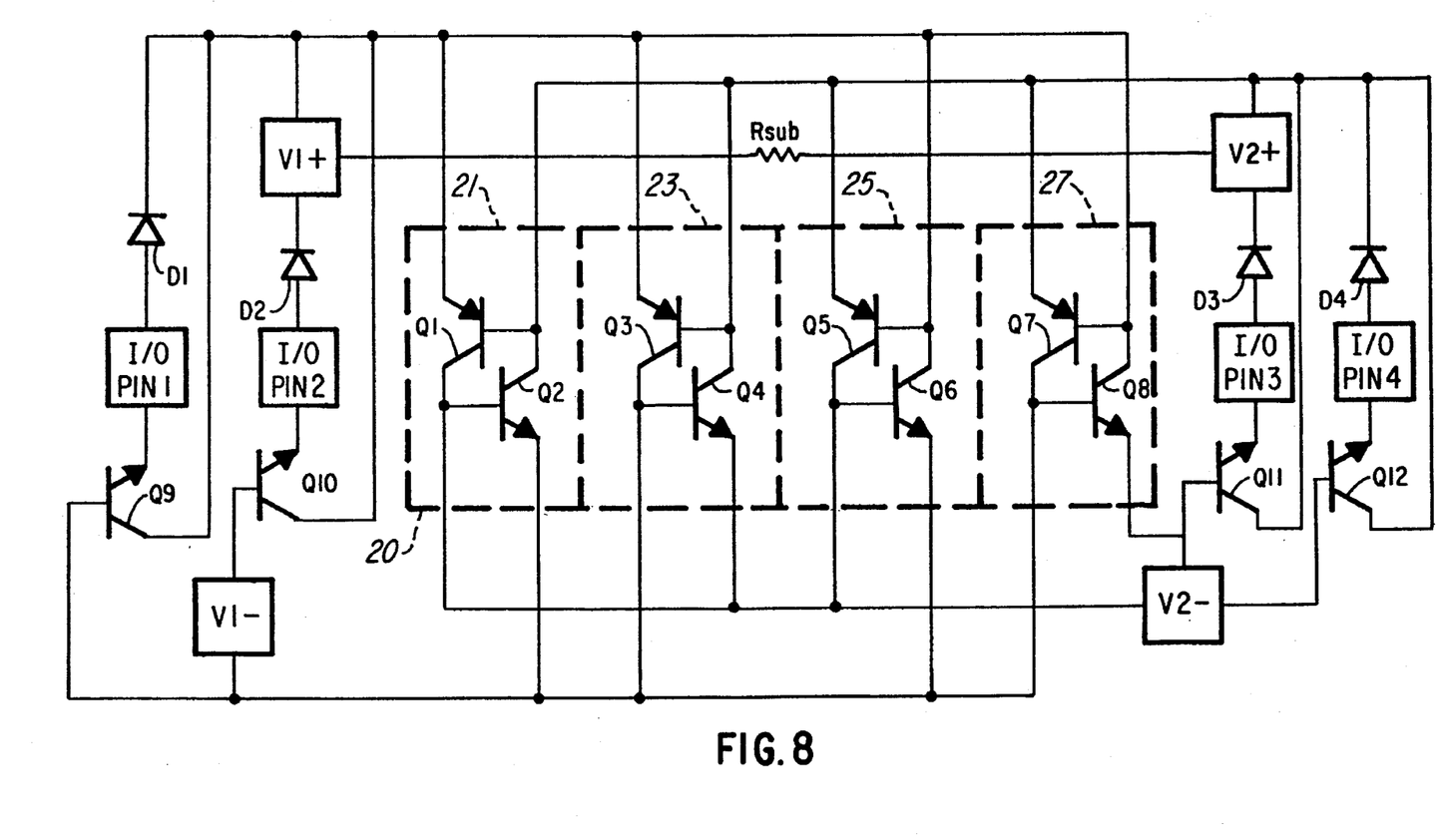
FIG. 8 shows the implementation of ESD protection circuit on a standard P well CMOS process.

FIG. 8 shows an ESD protection circuit implemented in the standard P/Well CMOS process. As would be understood by those skilled in the art the complement to this circuit could be implemented in an N/Well process. In the P or N Well process, a common substrate produces a substrate resistor R-Sub., which in the P/Well implementation is between the positive supply pins. A decrease in resistance of the substrate increases the difficulty of latching the SCRs in the clamping circuit 20. According to the principles of the invention, and as shown in regard to FIG. 8, transistors Q9 and Q10 may be substituted for the diodes, for example D2 and D4 shown in FIG. 4, between the I/O pins and the supply pin V1−. Similarly, transistors Q11 and Q12 are shown between I/O pins, 3 and pin 4 and the supply pin V2−. These transistors, Q9, Q10, Q11, and Q12 are formed using the base emitter diode of a vertical NPN transistor within the CMOS P/Well implementation. These NPN transistors provide additional discharge paths and allow application of the principles of the invention to CMOS N/Well or P/Well implementation.

For example and for purposes of explanation assuming a charge exists between I/O pin 1 and I/O pin 2. In that case the discharge path would be through D1 through SCR 21, comprising transistors Q1 and Q2 and transistor Q6 of SCR 25 and transistor Q3 of SCR 23, as shown in FIG. 3, to the supply pin V1− and through the base emitter junction of Q10. Additionally as base emitter current exists in Q10, the collector to emitter circuit of Q10 conducts forming a path from V1+ to I/O pin 2. A reverse charge path from I/O pin 2 would be through D2 and the SCR as shown in FIG. 3, the base emitter junction of Q9 and the collector emitter junction of Q9 to I/O pin 1. The electrostatic discharge paths in the case of charges for I/O pins 3 to 4, or reverse would be similar as explained above. The discharge paths in the case of charges on V1+, — or V2+ — would be as described above.

Figure 9:
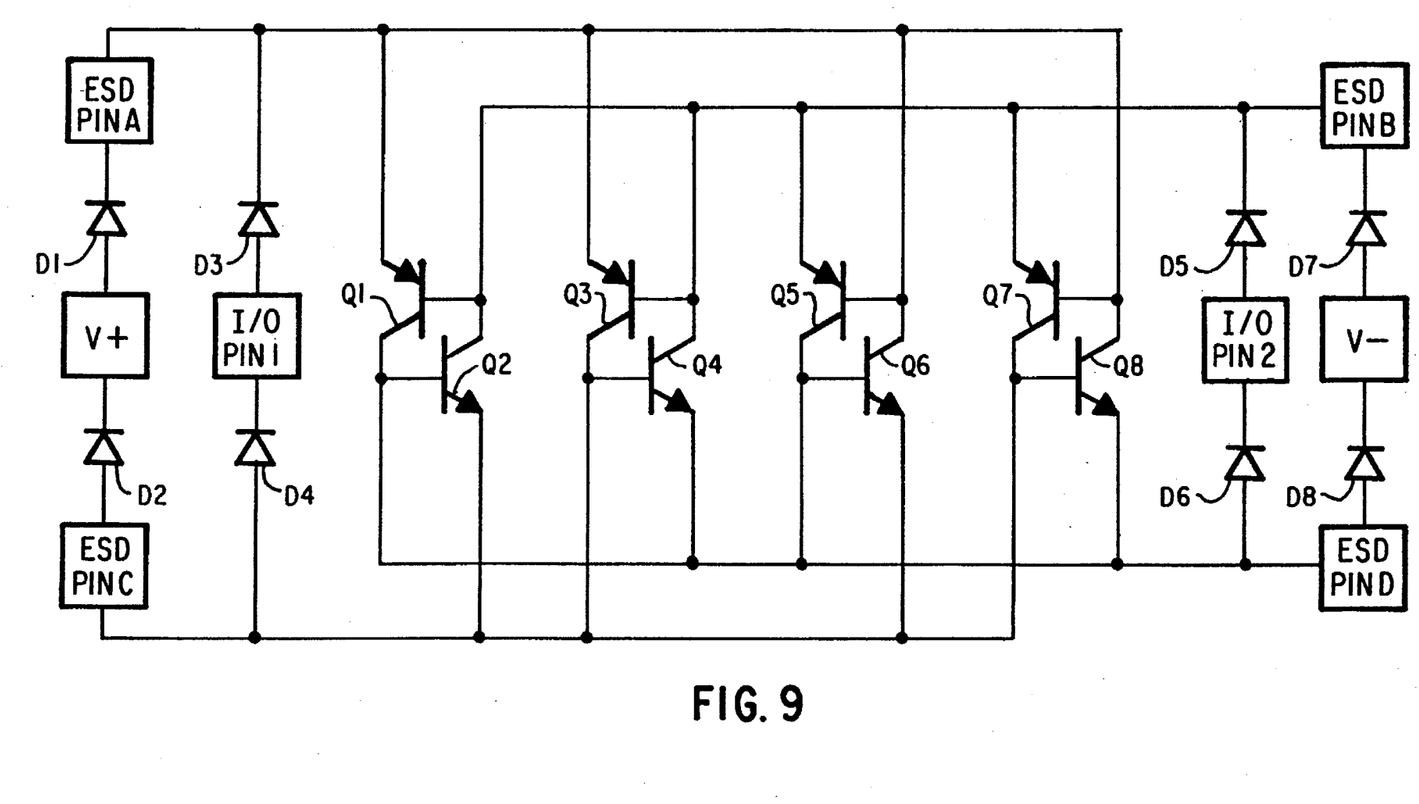
FIG. 9 shows the SCR clamping circuit of FIG. 4 with one set of supply pins and arranged to allow the I/O pins to operate above and below the supply voltage when the SCR circuit is disabled.

The characteristics of the SCR, namely its ability to latch under the influence of leakage current il and the transient idt current due to the transient voltage dv/dt at a voltage about that of the internal diode voltage, is used to provide a low voltage, low impedance discharge path between I/O pins or between floating supply pins in an inactive circuit, with the anode gate floating relative to the anode and the cathode gate floating relative to the cathode. The SCR clamping circuit of FIG. 9 is the same as the circuit shown in FIG. 4 with the positive negative supply pins V+ and V− arranged as are the IO pins. In addition, four pins are labeled differently, ESD pin A, ESD pin B, ESD pin C and ESD pin D as could be seen, by comparison with FIG. 4, these are the same as floating supply pins V1+, V1−, V2+ and V2−. These ESD pins A to D when connected in an operating circuit, prevent the SCR's from being placed in the on condition at the levels Vh and Ih. This is accomplished by shorting ESD pin A to ESD pin B and ESD pin C to ESD pin D. This effectively connects the anode gate to the anode and the cathode gate to the cathode of each of the SCRs 21, 23, 25, 27. In this way, the IO pins may be operated at voltages above and below the positive and negative supply voltages without the SCR clamping circuit clamping the input or output voltage as every IO pin or supply pin is connected to every other pin through at least one reversed biased diode. When the clamping circuit is on a PC board and the shorting connections between ESD pin A and ESD pin B and between ESD pin C and ESD pin D are broken making these connections open, then the SCR clamp operates as described above at the level Vh providing a low impedance discharge path between all pin combinations at a current in excess of Ih.

Figure 10:
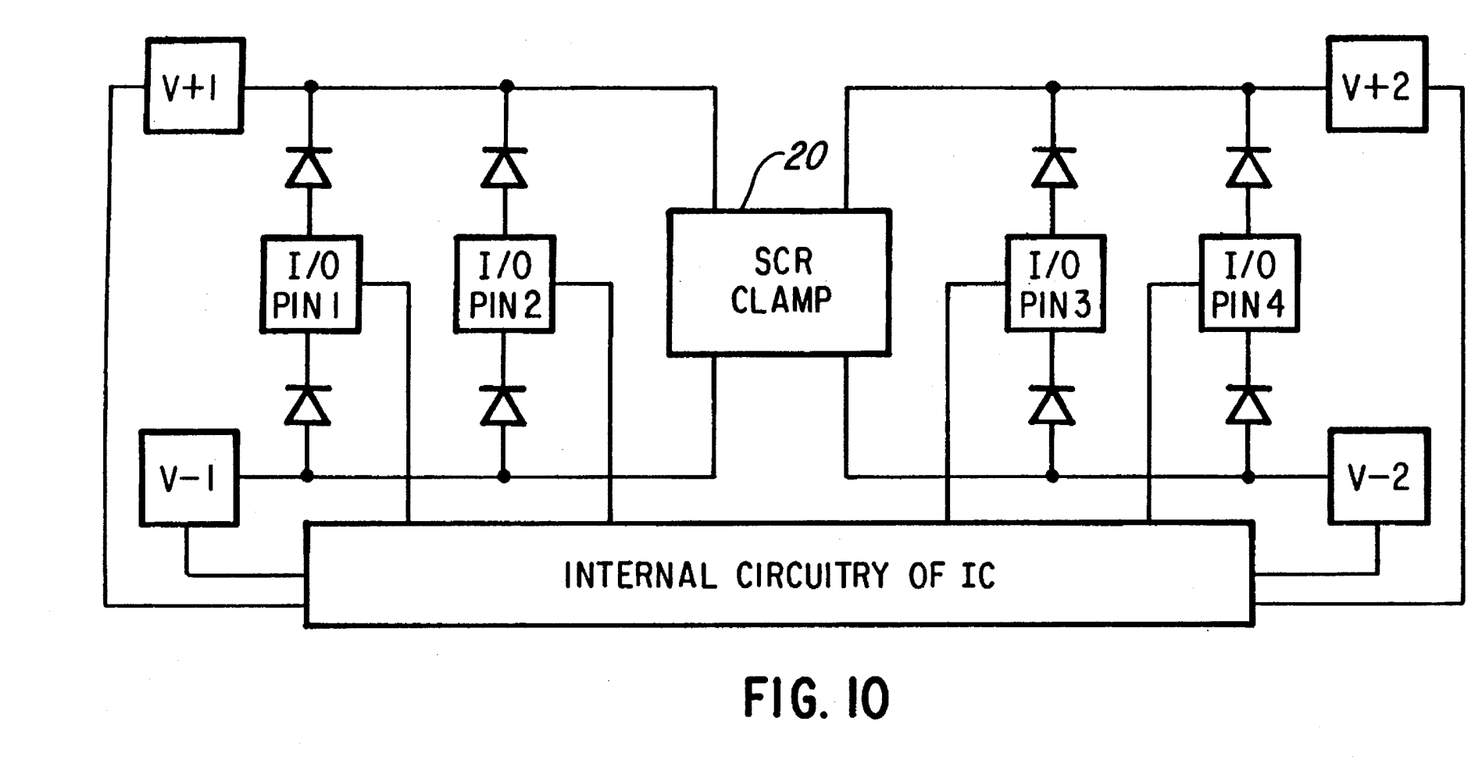
FIG. 10 shows how the ESD protection device may be connected to an IC.

The manner of connecting the SCR clamp to the internal circuitry of an IC is shown in FIG. 10. When the IC is mounted on a printed circuit board V1+ is shorted to V2+, and V1− is shorted to V2− through traces on the printed circuit board. These shorts prevent the SCR clamp circuit 20, from conducting. When the IC is removed from the printed circuit board the supply pins are no longer shorted to each other and the clamp circuit 20 is free to provide the low impedance and low voltage discharge paths previously disclosed.

The concept disclosed in this application may be implemented generally by using a clamp circuit having 4 terminals. The clamp circuit may have terminals 1 and 3 shorted together and terminals 2 and 4 shorted together when terminal 1 is connected to a positive supply and terminal 2 is connected to a negative supply then the clamping level will be above the power supply voltage. A means may be provided to disconnect the shorted pins in the clamp. For example, where pins 1 and 2 of the clamp are connected to the positive and negative voltage terminals, and pins 3 and 4 are connected to pins 1 and 2 of the clamp, the means may be a switch which may be used to disconnect pin 3 from pin 1 of the clamp and pin 4 from pin 2 from the clamp. These connections may be used as control connections to control the voltage levels of the clamp. Accordingly, when pin 3 is disconnected from pin 1 and pin 4 is disconnected from pin 2 of the clamp, the clamp is enabled at a second level which is lower than the power supply voltage.

Accordingly, what is shown and described in the preferred embodiment according to the inventive principles is a clamping circuit which may be operated at two clamping levels, above the power supply voltage and below the power supply voltage. A control means may be used to control the operation of the clamp to operate at one or the other of the clamp voltage levels. In the preferred embodiment, the way of switching between the two clamping levels is shown by connecting or removing connections to the pins connected to the power supply. However, as would be appreciated by those skilled in the art, other means may be used to vary the clamp level and the inventive principles are not restricted to the preferred embodiment shown.

I claim:

1. An ESD device for providing a discharge path for a static charge comprising:

a set of floating pins;

an SCR clamp having a plurality of SCR's;

each of said plurality of SCR's having SCR terminals each of said plurality of SCR's having separate anode, anode gate, cathode and cathode gate SCR terminals;

said SCR terminals of each of said plurality of SCR's being connected to a separate combination of said floating pins; and at least a first of said SCR's of said plurality of SCR's, is arranged to conduct in response to a potential between a pair of floating pins of said set of floating pins.

2. The ESD device of claim 1, wherein:

said set of floating pins is connected to said plurality of SCR's anode, anode gate, cathode and cathode gate terminals in at least four separate combinations of connections.

3. The ESD device of claim 2, wherein:

each of said four separate combinations of connections differs in at least one floating pin connection.

4. The ESD device of claim 1, wherein:

said set of floating pins is arranged in two pairs of floating pins including a first set of floating pins and a second set of floating pins;

said plurality of SCR's is arranged in a set of four SCR's;

a first of said set of four SCR's is connected by its anode to a first pin of said first set of floating pins and cathode to a second pin of said first set of floating pins, and anode gate to a first pin of said second set of floating pins and cathode gate to a second pin of said second set of floating pins; and a second of said set of four SCR's is connected, by its anode, to said first pin of said first set of floating pins and cathode to said second pin of said second set of floating pins, and anode gate to said first pin of said second set of floating pins and cathode gate to said second pin of said first set of floating pins; and a third of said set of four SCR's is connected by its anode to said first pin of said second set of floating pins and by its cathode to said second pin of said first set of floating pins, and by its anode gate connected to said first pin of said first set of floating pins and by its cathode gate to said second pin of said second set of floating pins; and a fourth of said set of four SCR's is connected by its anode to said first pin of said second set of floating pins and by its cathode to said second pin of said second set of floating pins, and by its anode gate connected to said first pin of said first set of floating pins and by its cathode gate to said second pin of said first set of floating pins.

5. The ESD device of claim 4, wherein:

said first of said set of four SCR's is arranged to conduct, produces conductive paths in said second and third SCR's of said set of four SCR's.

6. The ESD device of claim 4 wherein:

said cathode gate of said first of said set of four SCR's arranged to conduct provides base current to the cathode gate of said third SCR and the anode gate of said first SCR arranged to conduct provides base current to the anode gate of said second SCR; and said second and third SCR's are arranged to conduct in response to said base current.

7. The ESD device of claim 1, wherein:

said first of said SCR's is arranged to conduct in response to said potential producing a voltage and current levels above the holding voltage level and holding current level for said first of said SCR's.

8. The ESD device of claim 1, including:

said set of floating pins includes a plurality of pairs of floating pins;

a first set of terminals for connection of said ESD device to provide a discharge path;

each of said first set of terminals, connected to a said pair of said floating pins and to said SCR clamp;

said SCR clamp arranged to provide a conductive path for an electrostatic charge between of said first set of terminals.

9. The ESD device of claim 8, including:

said plurality of pairs of floating pins includes a first pair of floating pins;

a first transistor pair;

said first transistor pair is connected to a first pair of said terminals of said first set of terminals and connects said first pair of said terminals to said first and second floating pins in said first pair of floating pins.

10. The ESD device of claim 9 wherein:

one transistor of said first transistor pair is an NPN transistor and a second transistor of said first transistor pair is a PNP transistor.

11. The ESD device of claim 9, including:

a second transistor pair;

said second transistor pair is connected to a first set of said terminals and connects said first set of said terminals to first and second floating pins in said first pair of floating pins.

12. The ESD device of claim 11 including:

said plurality of floating pins includes a second pair of floating pins a third transistor pair, a second set of terminals for connection of said ESD device to provide a discharge path;

said third transistor pair is connected to said second set of terminals and connects said second set of terminals to said first and second floating pins of said second pair of floating pins.

13. The ESD device of claim 12 including:

a fourth transistor pair;

said fourth transistor pair is connected to said second set of terminals and connects said second set of terminals to said first and second floating pins in said second pair of floating pins.

14. The ESD device of claim 12 wherein:

one transistor of said third transistor pair is an NPN transistor and a second transistor of said third transistor pair is a PNP transistor.

15. The ESD device of claim 11 wherein:

one transistor of said second transistor pair is an NPN transistor and a second transistor of said second transistor pair is a PNP transistor.

16. The ESD device of claim 1, including:

said set of floating pins includes a first pair of floating pins;

a first set of terminals having a first terminal and a second terminal for connection of said ESD device to provide a discharge path;

a first transistor pair;

a first transistor of said first transistor pair is connected by its collector to first pin of said first pair of floating pins, by its base to second pin of said first pair of floating pins, and by its emitter to said first terminal of said first set of terminals; and a second transistor of said first transistor pair is connected by its base to said first pin of said first pair of floating pins, by its collector to said second pin of said first pair of floating pins and by its emitter to said second terminal of said first set of terminals; and said first transistor pair is arranged to provide a conductive path between said first set of terminals and said first pair of floating pins in response to a static charge on said first set of terminals.

17. The ESD device of claim 16 including, said set of floating pins includes a second pair of floating pins;

a second transistor pair;

a second set of terminals having a third terminal and a fourth terminal for connection of said ESD device to provide a discharge path; a first transistor of said second transistor pair is connected by its collector to a first pin of said second pair of floating pins, by its base to a second pin of said second pair of floating pins, and by its emitter to said third terminal and a second transistor of said second transistor pair is connected by its base to said first pin of said second pair of floating pins, by its collector to said second pin of said second pair of floating pins and by its emitter to said fourth terminal; and said second transistor pair is arranged to provide a conductive path between said second set of terminals and said second pair of floating pins in response to a static charge on said second set of terminals.

18. The ESD device of claim 17, including:

a third transistor pair;

a first transistor of said third transistor pair is connected by its collector to said first pin of said first pair of floating pins, by its base to said second pin of said first pair of floating pins, and by its emitter to said second terminal of said first set of terminals and a second transistor of said third transistor pair is connected by its base to the said first pin of said first pair of floating pins, by its collector to said second pin of said first pair of floating pins and by its emitter to said second terminal of said first set of terminals; and said third transistor pair is arranged to provide a conductive path between said first set of terminals and said first pair of floating pins in response to a static charge on said first set of terminals.

19. The ESD device of claim 18 including:

a fourth transistor pair;

a first transistor of said fourth transistor pair is connected by its collector to said first pin of said second pair of floating pins, by base to said second pin of said second pair of floating pins, and by its emitter to said fourth terminal; and an second transistor of said fourth transistor pair is connected by base to said first pin of said second pair of floating pins by its collector to said second pin of said second pair of floating pins and by its emitter to said fourth terminal.

20. The ESD device of claim 13 wherein:

one transistor of said fourth transistor pair is a NPN transistor and a second transistor of said fourth transistor pair is a PNP transistor.

* * * * *